(12) United States Patent
Mos et al.

(10) Patent No.: US 6,879,868 B2
(45) Date of Patent: Apr. 12, 2005

(54) ALIGNMENT SYSTEM FOR LITHOGRAPHIC APPARATUS FOR MEASURING A POSITION OF AN ALIGNMENT MARK

(75) Inventors: Everhardus Cornelis Mos, Eindhoven (NL); Maurits Van Der Schaar, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/822,735

(22) Filed: Apr. 13, 2004

(65) Prior Publication Data

US 2004/0187722 A1 Sep. 30, 2004

Related U.S. Application Data

(63) Continuation of application No. 10/079,826, filed on Feb. 22, 2002, now Pat. No. 6,732,004.

(30) Foreign Application Priority Data

Feb. 26, 2001 (EP) .............................................. 01301753

(51) Int. Cl.[7] .............................................. G06F 19/00
(52) U.S. Cl. ........................ 700/114; 700/121; 438/401
(58) Field of Search ................................ 700/124, 125, 700/114, 121; 438/401; 430/22

(56) References Cited

U.S. PATENT DOCUMENTS

| | | | |
|---|---|---|---|
| 4,780,617 A | * 10/1988 | Umatate et al. ............ 250/548 |
| 5,418,613 A | 5/1995 | Matsutani | |
| 5,657,129 A | * 8/1997 | Nishi .......................... 356/401 |
| 5,734,594 A | * 3/1998 | Chu et al. ................... 700/279 |
| 6,064,486 A | 5/2000 | Chen et al. | |
| 6,081,659 A | * 6/2000 | Garza et al. .................. 716/21 |
| 6,233,494 B1 | * 5/2001 | Aoyagi ....................... 700/121 |
| 6,261,918 B1 | 7/2001 | So | |
| 6,278,957 B1 | 8/2001 | Yasuda et al. | |
| 6,333,786 B1 | * 12/2001 | Uzawa et al. ............... 356/401 |
| 6,416,912 B1 | 7/2002 | Kobayashi et al. | |
| 6,483,571 B1 | * 11/2002 | Shiraishi ...................... 355/53 |

FOREIGN PATENT DOCUMENTS

EP        1 006 413 A2     6/2000

\* cited by examiner

*Primary Examiner*—Leo Picard
*Assistant Examiner*—Alexander Kosowski
(74) *Attorney, Agent, or Firm*—Pillsbury Winthrop, LLP

(57) ABSTRACT

An alignment system for a lithographic apparatus includes a detection system arranged in a path of at least a portion of an alignment radiation. The alignment system also includes a position determining unit in communication with the detection system. The position determining unit is adapted to measure a position of at least one alignment mark on a substrate. The substrate is overlaid with a layer of deposited material. A calculating unit is coupled to the position determining unit. The calculating unit calculates a corrected position of the alignment mark on the basis of the position of the at least one alignment mark being measured and a model of a process apparatus involved in a deposition of the layer of deposited material. The model taking into account an amount of deposition of the layer of deposited material.

22 Claims, 4 Drawing Sheets

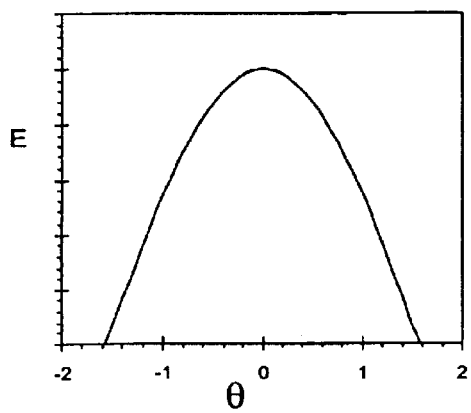
Fig. 5a
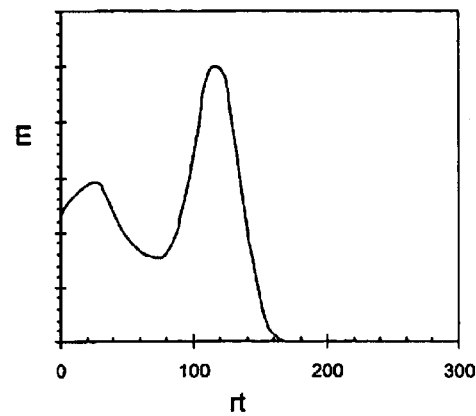
Fig. 5b
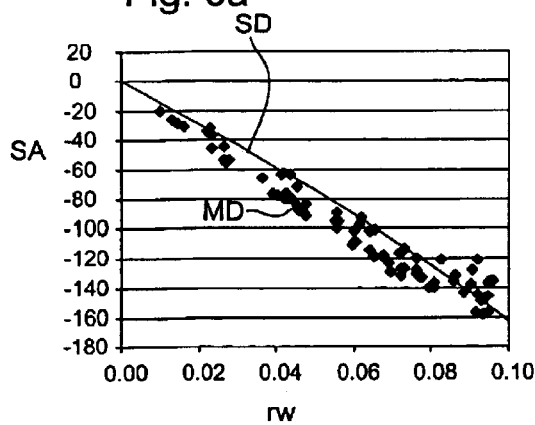
Fig. 6a
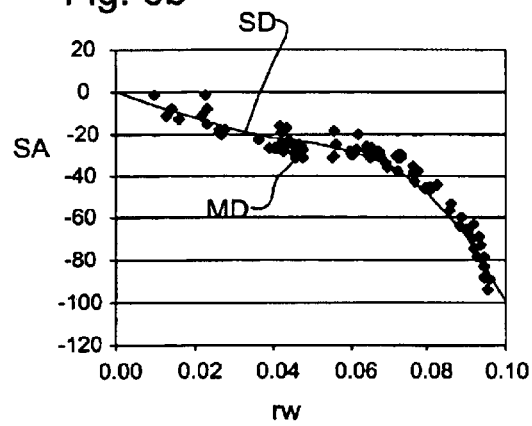
Fig. 6b
Fig. 7
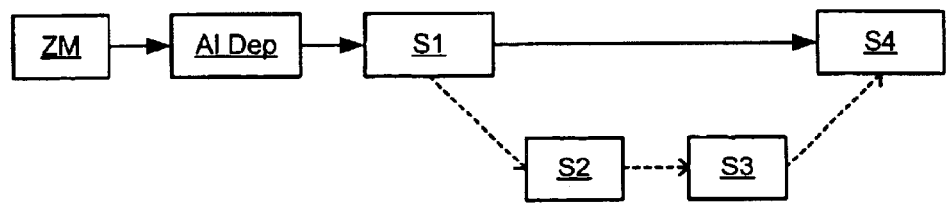

ALIGNMENT SYSTEM FOR LITHOGRAPHIC APPARATUS FOR MEASURING A POSITION OF AN ALIGNMENT MARK

This application is a continuation of U.S. patent application Ser. No. 10/079,826 filed Feb. 22, 2002, now U.S. Pat. No. 6,732,004 which in turn claims foreign priority from EP 01301753.8 filed Feb. 26, 2001, the entire contents of each of which are incorporated herein by reference.

BACKGROUND

2. Field of the Invention

The present invention relates to a computer program for determining a corrected position of an alignment mark on a substrate to be exposed in a lithographic projection apparatus comprising a radiation system for providing a projection beam of radiation; a support structure for supporting patterning means, the patterning means serving to pattern the projection beam according to a desired pattern; a substrate table for holding the substrate; a projection system for projecting the patterned beam onto a target portion of the substrate; and a measuring system for determining a position of an alignment mark on the substrate.

3. Discussion of Related Art

The term "patterning means" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below).

Examples of such patterning means include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning means can comprise one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning means as hereabove set forth.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, incorporated herein by reference.

Lithographic projection apparatus can be used, for example, in the manufacture of integrated circuits (ICs). In such a case, the patterning means may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the above mentioned manufacturing process and especially during the imaging step it is necessary to position the substrate and the mask on respective object tables with a high accuracy with regard to each other. For this purpose alignment marks are provided on the substrate and in the mask. An alignment system such as described for example in WO 98/39689 or U.S. Pat. No. 4,778,275 incorporated herein by reference, can be used to align a mark in the mask with respect to a corresponding mark on the substrate. If a mark on a substrate is not correctly aligned to the corresponding mark in the mask this alignment error will cause an error in the super-positioning of two images exposed on successive layers on the substrate. This error in the super-positioning of two images is generally called an overlay error. If a large overlay error occurs, the substrate or a device finally cut out of the substrate may be rejected during a quality inspection.

One of the first steps that is accomplished when a new substrate is to be manufactured in a lithographic projection apparatus is that alignment marks are exposed on the first layer of resist on the substrate. These marks will be used for aligning the subsequent images to be exposed in subsequent layers of resist on the substrate. The deposition of additional layers and the processing necessary to finish off these subsequent layers may affect the alignment mark such that the alignment mark is shifted in the plane of the substrate. This may cause overlay errors between layers on the substrate.

In EP 1 006 413 an apparent alignment offset caused by a resist layer on top of an alignment mark is detected using an off-line alignment tool to measure the mark shape before and after resist coating. An offset value derived thereby is provided to a lithography apparatus and used to correct alignment during an exposure. In U.S. Pat. No. 5,418,613 the wafer magnification due to a spin coated resist layer is determined by performing a statistical analysis on the measured position of a number of reference marks on the wafer and used to correct alignment during exposures.

SUMMARY

It is an object of the present invention to provide a computer program for determining a corrected position of a measured alignment mark on a substrate to be exposed in a lithographic projection apparatus.

This and other objects are achieved according to the invention in a computer program for determining a corrected position of an alignment mark on a substrate to be exposed in a lithographic projection apparatus, said computer program comprising program code means for, when executed on a computer system, instructing the computer system to perform the steps of controlling a measuring tool to measure the position of at least one alignment mark on said substrate overlaid with an Al layer; calculating a corrected position of the alignment mark on the basis of the measured position of the alignment mark and a model of a process apparatus involved in deposition of the Al layer.

The present inventors have determined that a significant source of overlay errors in the shift in position of alignment marks when overlaid by an Al (aluminum) layer and that the alignment shift can be predicted on the basis of a mould of the apparatus that was used to deposit the Al layer. By aligning the patterned beam onto a target portion of the substrate with the corrected position of the alignment mark it is possible to avoid overlay errors caused by process layers deposited upon an initial mark on a substrate.

Preferably, in the step of controlling a measuring tool, the positions of a plurality of alignment marks are measured; and said step of calculating a corrected position comprises using the measured positions of said plurality of alignment marks to find parameters of said model of said process apparatus.

In this approach, details of the geometry of the process apparatus used to apply an Al layer to a given substrate need not be known in advance but are determined or inferred from the measurements made on the substrate. This simplifies data flow and housekeeping in the device manufacturing process, particularly in relation to parameters of the process apparatus which are not stable in time, e.g. parameters changing due to target aging in a physical vapor deposition (PVD) tool. Where some parameters of the process apparatus are relatively static and known in advance, these may be included in the model. Alternatively, all parameters of the model may be derived from the measurement data.

Sets of parameters of the model may be derived for each substrate and used to correct the alignment of subsequent exposures of only the respective substrate. Alternatively, a set of parameters may be derived from measurements taken from one or more of the substrates in a batch and used to correct alignment in subsequent exposures of all substrates in the batch. Clearly, this is only appropriate where all the substrates have been processed in the same tool.

According to a further aspect of the invention there is provided a device manufacturing method comprising the steps of providing a substrate that is at least partially covered by a layer of radiation-sensitive material; providing a projection beam of radiation using a radiation system; using patterning means to endow the projection beam with a pattern in its cross-section; and projecting the patterned beam of radiation onto a target portion of the layer of radiation-sensitive material, characterized by the following steps: using a measuring system to measure the position of at least one alignment mark on said substrate overlaid with an Al layer; calculating a corrected position of the alignment mark on the basis of the measured position of the alignment mark and a model of a process apparatus involved in deposition of the Al layer; and using the corrected position of the alignment mark to align the patterned beam to a target portion of the substrate.

The present invention is also applicable to alignment marks overlaid with a layer of tungsten (W), such as in gates.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which:

FIG. 5a shows an angular emission profile of the apparatus of FIG. 2;

FIG. 5b shows a radial emission profile of the apparatus of FIG. 2;

FIG. 6a shows a graph of a predicted shift and a measured shift as a function of radial distance;

FIG. 6b shows the same graph as FIG. 6a for a different physical vapor deposition apparatus; and FIG. 7 is a flow diagram of a process according to a second embodiment of the invention.

In the figures, corresponding reference symbols indicate corresponding parts.

DETAILED DESCRIPTION OF EMBODIMENTS OF THE INVENTION

4. Embodiment 1

Figure 1:
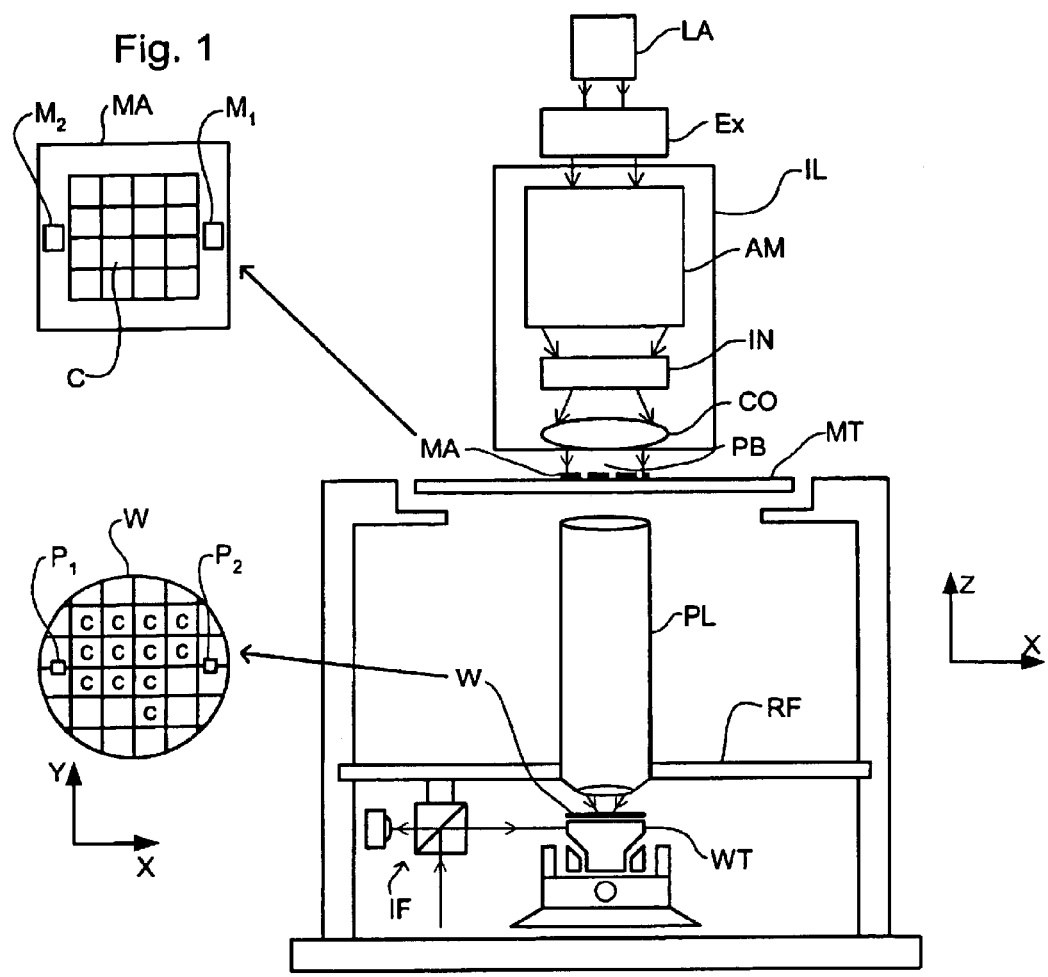
FIG. 1 depicts a lithographic projection apparatus processing a substrate.

FIG. 1 schematically depicts a lithographic projection apparatus according to a particular embodiment of the invention. The apparatus comprises:

a radiation system Ex, IL, for supplying a projection beam PB of radiation (e.g. UV or EUV radiation, X-ray, ions or electrons). In this particular case, the radiation system also comprises a radiation source LA;

a first object table (mask table) MT provided with a mask holder for holding a mask MA (e.g. a reticle), and connected to first positioning means for accurately positioning the mask with respect to item PL;

a second object table (substrate table) WT provided with a substrate holder for holding a substrate W (e.g. a resist-coated silicon wafer), and connected to second positioning means for accurately positioning the substrate with respect to item PL;

a projection system ("lens") PL (e.g. a refractive or catadioptric system, a mirror group or an array of field deflectors) for imaging an irradiated portion of the mask MA onto a target portion C (e.g. comprising one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning means, such as a programmable mirror array of a type as referred to above.

The source LA (e.g. a Hg lamp, excimer laser, an undulator provided around the path of an electron beam in a storage ring or synchrotron, a plasma source or an electron or ion beam source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

For alignment of the target portion C1 in mask MA with respect to the target portions C on the substrate W the mask is provided with mask alignment marks M2 and M1 and the substrate is provided with alignment marks P1 and P2. An alignment system such as described for example in WO 98/39689 or U.S. Pat. No. 4,778,275, incorporated herein by reference, can be use for that purpose.

Figure 1A:
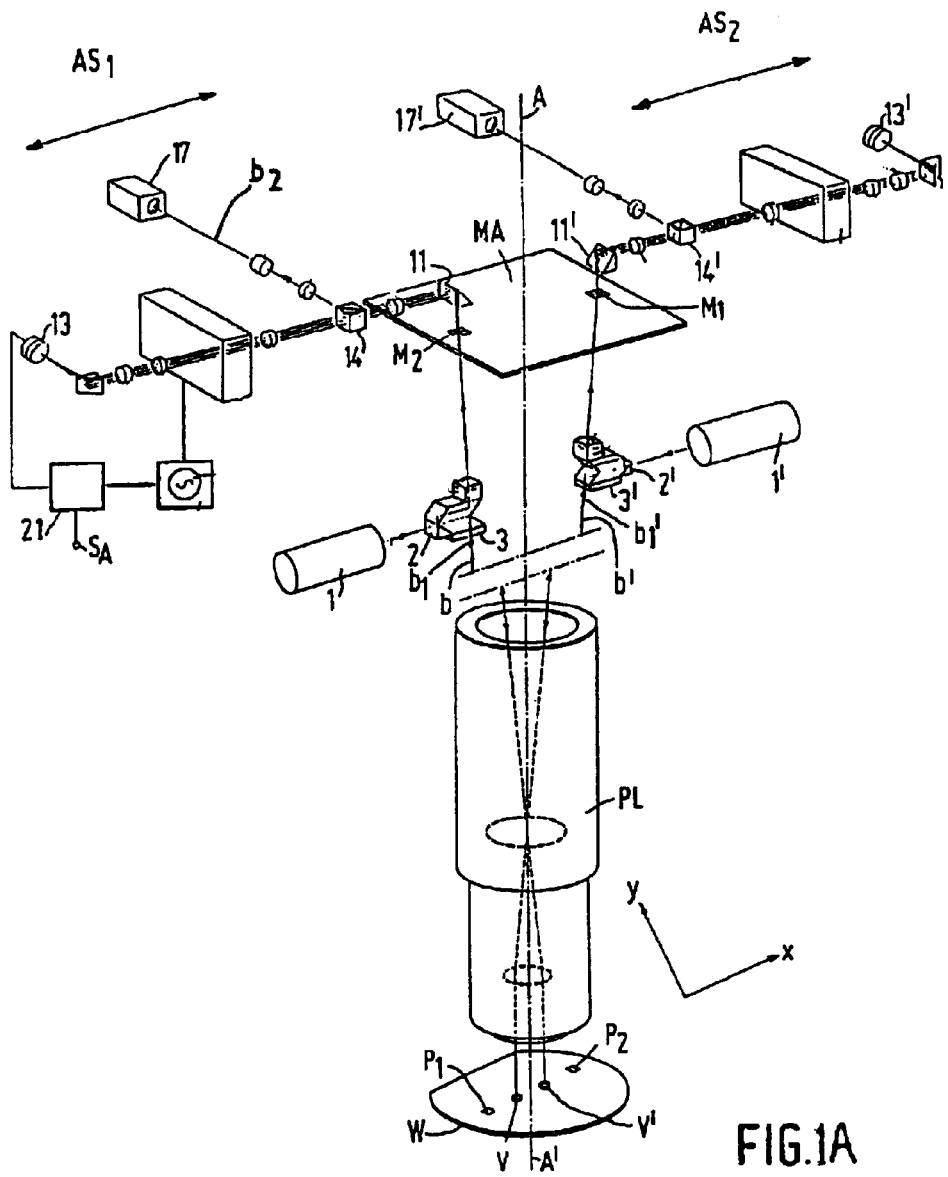
FIG. 1A depicts an exemplary alignment system according to an embodiment of the present invention.

In one embodiment, the alignment system comprises two separate and identical alignment systems $AS_1$ and $AS_2$ which are arranged symmetrically relative to the optical axis AA' of the projection-lens system PL, as shown in FIG. 1A. The alignment system $AS_1$ is associated with the mask mark $M_2$ and the alignment system $AS_2$ with the mask mark $M_1$. Corresponding elements of the two alignment systems bear identical reference numerals, the reference numerals of the elements of the system $AS_2$ being primed to distinguish them from those of the system $AS_1$.

The construction of the system $AS_1$ and the manner in which the relative position of the mask mark $M_2$ and the substrate mark $P_1$ is determined by means of this system will now be described first.

The alignment system $AS_1$ comprises a radiation source 1, for example a helium-neon laser, which emits an alignment beam b. A beam splitter 2 reflects this beam to the substrate W. The beam splitter may comprise a semi-transparent mirror or a semi-transparent prism, but suitably comprises a polarisation-sensitive prism followed by a $\lambda/4$ plate 3, where $\lambda$ is the wavelength of the beam b. The projection-lens system PL focuses the beam b to form a small radiation spot V of a diameter of the order of 1 mm onto the substrate W. This substrate reflects a part of the beam as the beam $b_1$ towards the mask M. The beam $b_1$ traverses the projection-lens system PL, which system images the radiation spot V on the mask. Before the substrate is mounted in the exposure apparatus it is so pre-aligned in a pre-alignment station coupled to the arrangement, for example a station as described in European Patent Application No. 0,164,165, that the radiation spot V is situated on the substrate mark $P_1$. This mark is then imaged onto the mask mark $M_2$ by the beam $b_1$. Allowing for the magnification M of the projection-lens system, the dimension of the mask mark $M_2$ is adapted to that of the substrate mark $P_1$, so that in the case of a correct positioning of the two marks relative to each other the image of the mark $P_1$ coincides accurately with the mark $M_2$.

On its way towards and back from the substrate W the beam b, and the beam $b_1$ respectively, has twice traversed the $\lambda/4$ plate 3, the optic axis of this plate extending at an angle of 45° to the direction of polarization of the linearly polarized beam b issuing from the source 1. The beam $b_1$ traversing the $\lambda/4$ plate then has a direction of polarization which is rotated through 90° relative to the beam b, so that the beam $b_1$ is transmitted by the polarization separating prism 2. The use of the polarization separating prism in conjunction with the $\lambda/4$ plate has the advantage that the alignment beam can be coupled into the radiation path of the alignment system with a minimal loss of radiation.

The beam $b_1$ transmitted by the alignment mark $M_2$ is reflected by a prism 11 and is directed towards a radiation-sensitive detector 13, for example by another reflecting prism 12. This detector is, for example, a composite photodiode comprising, for example, four separate radiation-sensitive areas. The output signals of these detectors are a measure of the registration of the mark $M_2$ with the image of the substrate mark $P_1$. These signals can be processed electronically and may be employed to move the mask and the substrate relative to each other by means of drive systems, not shown, in such a way that the image of the mark $P_1$ coincides with the mark $M_2$. Thus, an automatic alignment arrangement is obtained. The signal from the detector 13 is amplified and processed in a phase-sensitive detection circuit 21, which also receives a signal $V_B$. The output signal $S_A$ then constitutes the desired dynamical alignment signal.

A beam splitter 14, for example a semitransparent prism, may be arranged between the prism 11 and the detector 13 to split off a part of the beam $b_1$ so as to form a beam $b_2$. The split-off beam $b_2$ is incident on a television camera 17, which is coupled to a monitor, not shown, on which the alignment marks $P_1$ and $M_2$ are displayed for the operator of the exposure apparatus. The operator can then establish whether the two marks coincide or can move the substrate W by means of manipulators in order to make the marks coincide.

In a way similar to that described above for the marks $M_2$ and $P_1$ the marks $M_1$ and $P_1$ and the marks $M_1$ and $P_2$ can also be aligned relative to one another. For the two last-mentioned alignments the alignment system $AS_2$ is employed.

Before the substrate W is introduced into the exposure apparatus it has been pre-aligned coarsely, that is within an accuracy of some tens of $\mu$m, in a pre-alignment station in such a way that one of the alignment beams b or b' is incident on one of the substrate marks $P_1$ or $P_2$. It is possible to ensure that first the substrate mark $P_1$ is situated in the radiation path of the system $AS_1$, that is in the beam b. By means of the system $AS_1$ and by moving the substrate and the mask relative to each other in the X-direction and the Y-direction the marks $P_1$ and $M_2$ are aligned relative to one another.

The displacement of the substrate and the mask relative to each other is measured with a very accurate two-dimensional displacement system, for example the interferometer system described in U.S. Pat. No. 4,251,160. This system, which is represented schematically in FIG. 1 where it bears the reference IF, cooperates very closely with the alignment systems $AS_1$ and $AS_2$. As the instant at which the alignment system $AS_1$ ascertains that the marks $P_1$ and $M_2$ are aligned correctly, the interferometer system determines where the substrate mark $P_1$ is situated in the coordinate system defined by the interferometer system. The position of the image of the mask mark $M_2$ on the substrate is then known and hence the position in the X-direction and the Y-direction of the local image of the mask pattern C on the substrate.

Subsequently, the substrate mark $P_1$ is brought into the path of the beam b' and the alignment system $AS_2$ is employed to align this mark relative to the mask mark $M_1$. By means of the displacement measuring system it is then established at which angle and over which distance the substrate is displaced in the coordinate system defined by this measuring system, in order to bring the mark $P_1$ in register with the mark $M_1$. This not only gives the angular orientation of the image of the line interconnecting the centers of the mask marks $M_1$ and $M_2$, that is the angular orientation of the mask MA, but the magnification with which the distance between the marks $M_1$ and $M_2$ in the mask is imaged in the substrate plane is then also known. Consequently, it is known with which magnification the mask pattern C is imaged onto the substrate. This information may be employed in order to correct the magnification with which the projection-lens system PL forms an image, for example by adapting the distance between the mask and the lens system. This adaptation will hardly affect the imaging quality.

Finally, the substrate mark $P_2$ is moved into the path of the alignment beam b', and, again by means of the system $AS_2$, the marks $P_2$ and $M_1$ are aligned relative to one another. During this alignment the angular orientation of the substrate, that is the angle between the line interconnecting the centers of the marks $P_1$ and $P_2$ and the X-direction, is determined. During the alignment of the mark $P_2$ relative to the mark $M_1$ the substrate is moved, for example by a combination of a translation and a rotation, so that a possible angular error is eliminated during this alignment. As during the change from position 2 to position 3 the displacement of the substrate is also measured by means of the interferometer system the distance between the substrate marks $P_1$ and $P_2$ is also known. During the repeated imaging of the mask pattern C onto the substrate it is then possible to correct for variations in this distance, which variations may be caused for example, by thermal expansion of the substrate of warping of this substrate.

The depicted apparatus can be used in two different modes.

In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
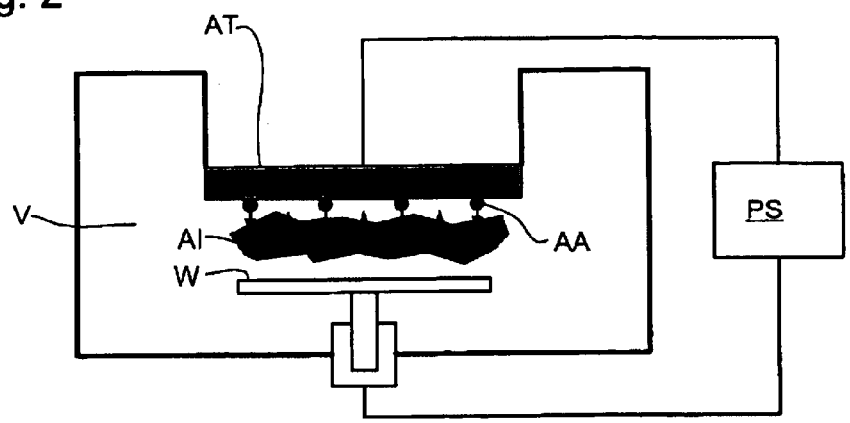
FIG. 2 depicts schematically a physical vapor deposition apparatus processing a substrate.

Before a substrate W is processed in a lithographic projection apparatus the substrate (wafer) can be processed in a different processing tool, for example a physical vapor deposition apparatus. This processing may have an influence on a measured position of a mark on a substrate. In a physical vapor deposition process as shown in FIG. 2, an aluminum target AT and a wafer W are placed in a vacuum chamber VC of the physical vapor deposition apparatus. A plasma of argon ions AI and free electrons is formed between the wafer W and the aluminum target AT. Driven by the electric field produced by the electric source PS between target AT and wafer W, the argon ions AI hit the target AT. As a result aluminum particles AA leave the target AT and are deposited on the wafer W. An aluminum atom AA arriving from the aluminum target AT on a particular point on the wafer W will cause the surface at that particular point to grow towards the origin of the aluminum atom AA. The resulting angle of growth will vary randomly during the deposition process.

Figure 3:
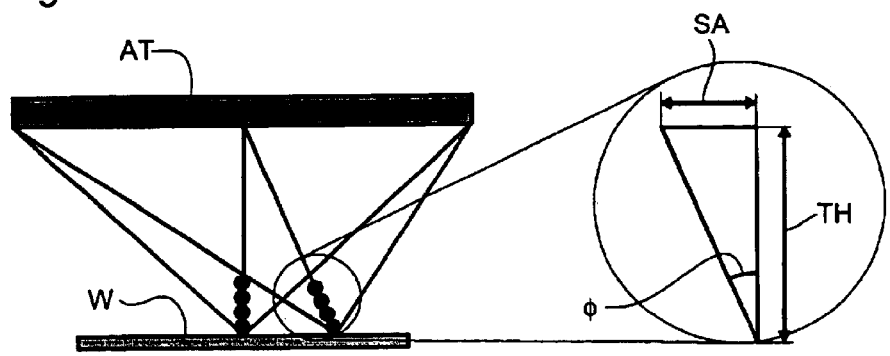
FIG. 3 depicts a one-dimensional model of the physical vapor deposition apparatus of FIG. 2.

FIG. 3 shows that for a large numbers of aluminum particles AA, the angle of growth $\Phi$ will be equal to the average deposition angle of the particles, which depends on the radial position on the wafer W. In this model we assume that the emission of aluminum particles AA is uniformly distributed over the aluminum target AT. If we also assume that particles AA leave the aluminum target AT with uniformly distributed random angles, the average aluminum atom AA arriving at the wafer W originates from the middle M of the target AT for each position on the wafer W. In the middle of the wafer W the average angle $\Phi$ of growth is perpendicular to the wafer W. Away from the middle of the wafer W the average angle $\Phi$ of growth is not perpendicular to the wafer W and as a result the wafer surface at these points will be shifted with a shift SA as a function of the thickness TH of the growing layer. It is estimated that the average growth angle $\Phi$ is a function of the radial position on the wafer W. In a physical vapor deposition apparatus the aluminum target AT is in general round and the emission of aluminum particles AA depends on the emission position on the target AT and the emission angle from the target. In the next paragraphs the average angle of metal deposition on a wafer will be calculated for a physical vapor deposition apparatus. For this the angular probability distribution of deposition as a function of the radial position on the wafer W will be derived.

Figure 4:
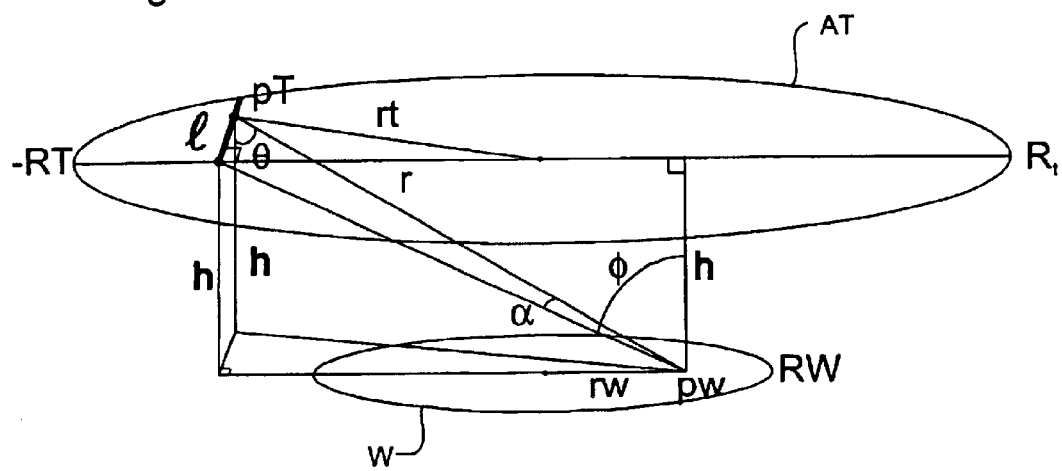
FIG. 4 shows the geometry of the physical vapor deposition chamber of the apparatus of FIG. 2.

FIG. 4 shows the geometry of a physical vapor deposition chamber. The aluminum target AT with diameter 2 RT is bombarded with argon ions and emits aluminum particles AA. The particles AA are deposited on the wafer W with diameter 2 RW that is placed at a distance h from the aluminum target AT. At position PW at radius rw on the wafer W, metal particles arrive from all possible angles. Using the symmetry around the radial axis through PW we see that all metal particles arriving at point PW that originate from line l (a line in a direction perpendicular to the radius of the target) make the metal grow in the direction $\Phi$. An atom from position PT on line l is emitted from angle $\theta$ and arrives at the wafer surface with angle $\alpha$ with respect to the growth angle $\Phi$. Thus the contribution of growth from PT in direction $\Phi$ is equal to the projection $\cos(\alpha)$ times the emission from point PT. The emission from this point PT depends on the emission angle $\theta$ and the radial position on the target rt. The angular dependency follows from a collision model and is cosine shaped, meaning that emission in a direction perpendicular to the target AT is more likely then emission parallel to the target AT. The emission as a function of radial position on the target AT can be determined. The radial emission profile is a result of the shape of the plasma.

The angular and radial emission profiles of the aluminum target are shown in FIGS. 5a and 5b. FIG. 5a shows the emission of the aluminum target as a function of the angle $\theta$ in radians and FIG. 5b shows the emission profile as a function of the radial position rt in mm. The probability $F_\Phi(\Phi)$ for an aluminum atom AA at position pw to originate from angle $\Phi$ can be found by dividing the deposition from a direction given by the angle $\Phi$ by the deposition from all possible angles. So we can write:

$$F_\phi(\phi) = \frac{\int_{line\ l} \cos(\alpha) E(\theta, rt) dy}{\iint_{Target} \cos(\alpha) E(\theta, rt) dy d\phi} \quad (1)$$

Parameters $\alpha$, $\theta$ and rt in Eq. (1) are a function of rw, $\Phi$ and y as can be seen from FIG. 4. $E(\Phi, rt)$ is the emission in a particular direction from a particular position. We can compute the average deposition angle $\Phi$ av as a function of wafer radial position rw. The average angle is defined by:

$$\phi_{av} = \int_{\phi_{min}}^{\phi_{max}} \phi F_\phi(\phi) d\phi, \quad (2)$$

where the integral is over all possible angles from the left edge to the right edge of the target. Equation (2) is numerically evaluated using a fourth order Runge-Kutta integration algorithm.

The results of simulations (line SD) are shown in FIGSS. 6a and 6b together with measured data (boxes MD). In these graphs the predicted shift SA in nm is plotted for two different tools as a function of rw in m. In FIG. 6a a graph of a tool is shown with an increased target AT to wafer W distance with respect the tool used for the plot of FIG. 6b. The validity of the model is confirmed by agreement of measured and predicted shift SA for both tools.

A computer program in which the above model is implemented may now be used to calculate the shift SA for a particular vapour deposition apparatus and for a particular position on the substrate W. The calculated shift SA can then be used to calculate a corrected position of a measured alignment mark position in a lithographic projection apparatus to improve the overlay between layers on a wafer.

5. Embodiment 2

In a second embodiment of the invention, rather than using known or directly measured physical parameters of the deposition apparatus, the necessary parameters for a model of the apparatus are found from measured positions of a plurality of alignment markers on a substrate.

Accordingly, after function of the zero marks (that is alignment marks etched into the bare substrate) at step ZM, and deposition of an Al layer, at step Al Dep, the second embodiment follows the following basic procedure, illustrated in FIG. 7:

S1. measure the position of a number of marks on a substrate,

S2. find parameters of a model that best fit the measured data,

S3. estimate the metal-induced scaling of the substrate based on the parameters found, and S4. carry out subsequent exposures using the estimated scaling to correct alignment of the substrate.

As represented by the solid arrow, the substrate proceeds directly from step S1, measurement, to step S4, subsequent exposure, whilst steps S2 and S3 involve only data processing, represented by dashed lines. The measurement step, S1, may be carried out on the lithographic apparatus which performs the subsequent exposures, S4, so that there may be no physical movement of the substrate between these steps.

The number of markers whose position is to be measured depends on the number of parameters of the model to be found. The number of measurements must be sufficiently larger that the number of parameters to average out noise, including metal-induced noise, i.e. random shifts in apparent mark position due to irregularities in the deposited metal layer. The measurements may be made using the alignment system of the lithographic apparatus or using an off-line metrology tool. The markers whose positions are measured may include markers provided on the substrate for alignment in the exposure process or other purposes and/or additional markers provided specifically for measurement of the Al-induced shift.

The model used in Embodiment 1 may be used, with the parameters α, θ and rt derived from the measurement data rather than directly from the tool. Preferably the model represents as close as possible the geometry of the process tool (deposition apparatus) whose effect is being modelled. In this case the model may include parameters directly reflecting the dimensions of the tool and some of these may be known in advance. In a simpler form, the model is a polynomial, e.g. $3^{rd}$ or $4^{th}$ order, function of radial position on the substrate. In this case, the polynomial coefficients indirectly and approximately represent the geometry of the process tool, the polynomial model being an approximation rather than an exact model. A piece-wise linear model may also be used.

A polynomial model of the metal induced scaling may take the form:

$$f(r) = m_1.r + m_2.r^2 + m_3.r^3 + m_4.r^4 \quad (3)$$

where r is the radial position of a mark and $m_n$ is the $n^{th}$ polynomial coefficient. The measured position information is then fitted to the function:

$$a.r + b.f(r) \quad (4)$$

where a is a parameter representing the thermal scaling (expansion or contraction) of the substrate as a whole, and b represents the thickness of the Al layer. Parameters a and b may be known in advance for a specific substrate or found from the measured data, along with the polynomial coefficients. This models the radial movement of the marks (wafer scaling) with respect to the centre of the substrate. Another model, which may be of similar form, can be used to model the tangential movement of the marks (wafer rotation).

While specific embodiments of the invention have been described above, it will be appreciated that the invention may be practiced otherwise than as described. The description is not intended to limit the invention.

We claim:

1. An alignment system for a lithographic apparatus, comprising:

a source of alignment radiation;

a detection system arranged in an alignment radiation path from said source;

a position determining unit in communication with said detection system, said position determining unit being adapted to measure a position of an alignment mark on a substrate, said substrate being overlaid with a layer of deposited material; and a calculating unit in communication with said position determining unit, wherein said calculating unit is adapted to calculate a corrected position of the alignment mark on the basis of the position of said alignment mark being measured and a model of a process apparatus involved in a deposition of the layer of deposited material, said model taking into account an amount of deposition of said layer of deposited material.

2. An alignment system for a lithographic apparatus as recited in claim 1, wherein said position determining unit is adapted to measure a position of a plurality of alignment marks and said calculating unit is adapted to calculate the corrected position using the measured positions of said plurality of alignment marks to find parameters of said model of said process apparatus.

3. An alignment system for a lithographic apparatus as recited in claim 2, wherein said plurality of alignment marks are positioned at a plurality of different radial positions of said substrate.

4. An alignment system for a lithographic apparatus as recited in claim 2, wherein said corrected position is determined by using the measured positions of said plurality of alignment marks to find parameters of said model of said process apparatus, and said model is of the form:

a.r+b.f(r)

where r is the radial position of an alignment mark, a is a parameter relating to thermal expansion of the substrate, b is a parameter relating to the thickness of said layer of deposited material and f(r) is a polynomial function.

5. An alignment system for a lithographic apparatus as recited in claim 1, wherein said model is at least a third-order function of a radial position of said alignment mark on said substrate.

6. An alignment system for a lithographic apparatus as recited in claim 1, wherein the position determining unit is adapted to measure positions of a plurality of alignment marks on a first wafer and at least one alignment mark on a second wafer, the measured positions of said plurality of alignment marks on said first wafer are used to find parameters of said model, and a corrected position of said at least one alignment mark on the second wafer is calculated.

7. An alignment system for a lithographic apparatus as recited in claim 1, wherein said process tool is a physical vapor deposition apparatus.

8. An alignment system for a lithographic apparatus as recited in claim 1, wherein the layer of deposited material is a layer of aluminum.

9. An alignment system for a lithographic apparatus as recited in claim 1, wherein the layer of deposited material is a layer of tungsten.

10. An alignment system for a lithographic apparatus as recited in claim 1, wherein said model is a statistical model of a deposition process.

11. An alignment system for a lithographic apparatus as recited in claim 1, wherein said model is an empirical parameterization having parameters determined from said measured position of said at least one measured alignment mark.

12. A lithographic projection apparatus, comprising:

an illumination system adapted to provide illumination radiation;

a substrate stage assembly adapted to be arranged in a path of said illumination radiation, said substrate stage being configured to hold a substrate;

a reticle stage assembly adapted to be arranged in said path of said illumination radiation between said illumination system and said substrate stage assembly;

a projection system arranged between said reticle stage assembly and said substrate stage assembly; and an alignment system adapted to be arranged proximate said substrate stage assembly, wherein said alignment system comprises:

a detection system adapted to be arranged in a path of at least a portion of alignment radiation;

a position determining unit in communication with said detection system, said position determining unit being adapted to measure a position of an alignment mark on the substrate, said substrate being overlaid with a layer of deposited material; and a calculating unit in communication with said position determining unit, wherein said calculating unit is adapted to calculate a corrected position of the alignment mark on the basis of the position of said alignment mark being measured and a model of a process apparatus involved in a deposition of the layer of deposited material, said model taking into account an amount of deposition of said layer of deposited material.

13. A lithographic projection apparatus as recited in claim 12, wherein said position determining unit in said alignment system is adapted to measures a position of a plurality of alignment marks and said calculating unit is adapted to calculate the corrected position using the measured positions of said plurality of alignment marks to find parameters of said model of said process apparatus.

14. A lithographic projection apparatus as recited in claim 13, wherein said plurality of alignment marks are positioned at a plurality of different radial positions of said substrate.

15. A lithographic projection apparatus as recited in claim 13, wherein said corrected position is determined by using the measured positions of said plurality of alignment marks to find parameters of said model of said process apparatus, and said model is of the form:

$$a.r + bf(r)$$

where r is the radial position of an alignment mark, a is a parameter relating to thermal expansion of the substrate, b is a parameter relating to the thickness of said layer of deposited material and f(r) is a polynomial function.

16. A lithographic projection apparatus as recited in claim 12, wherein said model is at least a third-order function of a radial position of said alignment mark on said substrate.

17. A lithographic projection apparatus as recited in claim 12, wherein the position determining unit in said alignment system measures positions of a plurality of alignment marks on a first wafer and at least one alignment mark on a second wafer, the measured positions of said plurality of alignment marks on said first wafer are used to find parameters of said model, and a corrected position of said at least one alignment mark on the second wafer is calculated.

18. A lithographic projection apparatus as recited in claim 12, wherein said process tool is a physical vapor deposition apparatus.

19. A lithographic projection apparatus as recited in claim 12, wherein the layer of deposited material is a layer of aluminum.

20. A lithographic projection apparatus as recited in claim 12, wherein the layer of deposited material is a layer of tungsten.

21. A lithographic projection apparatus as recited in claim 12, wherein said model is a statistical model of a deposition process.

22. A lithographic projection apparatus as recited in claim 12, wherein said model is an empirical parameterization having parameters determined from said measured position of said at least one measured alignment mark.

* * * * *

UNITED STATES PATENT AND TRADEMARK OFFICE
CERTIFICATE OF CORRECTION

| | | |
|---|---|---|
| PATENT NO. | : 6,879,868 B2 | Page 1 of 1 |
| APPLICATION NO. | : 10/822735 | |
| DATED | : April 12, 2005 | |
| INVENTOR(S) | : Mos et al. | |

It is certified that error appears in the above-identified patent and that said Letters Patent is hereby corrected as shown below:

On the title page: item

(30) Foreign Application Priority Data

Replace "Feb. 26, 2001    (EP) .......................................... 01301753"

With --Feb. 26, 2001    (EP) .......................................... 01301753.8--

Column 10, line 57, change "FIGSS," to -- FIGS. --

Column 14, line 16, change "a.r+bf(r)" to -- a.r+b.f(r) --

Signed and Sealed this

Twenty-fourth Day of April, 2007

JON W. DUDAS
*Director of the United States Patent and Trademark Office*